FLUID COOLED ELECTRONIC CHASSIS

Filed July 29, 1957 2 Sheets-Sheet 1

Inventor
STEPHAN R. WAGNER
By [signature]
Attorney

Nov. 10, 1959 S. R. WAGNER 2,912,624

FLUID COOLED ELECTRONIC CHASSIS

Filed July 29, 1957 2 Sheets-Sheet 2

Inventor
STEPHAN R. WAGNER
By Percy P. Lantzy
Attorney 2,912,624

FLUID COOLED ELECTRONIC CHASSIS

Stephan R. Wagner, East Orange, N.J., assignor to International Telephone and Telegraph Corporation, Nutley, N.J., a corporation of Maryland Application July 29, 1957, Serial No. 674,909

6 Claims. (Cl. 317—100)

This invention relates to cooling of electronic equipment and more particularly to fluid cooled electronic chassis.

In many applications of electronic equipment the trend is toward smaller compact units. This is particularly evident in equipment designed for aircraft where one of the major objectives is to obtain a maximum amount of equipment in the smallest space and with the least weight. As the allotted space decreases, the components of these equipments must be mounted closer together and this in turn creates greater heat dissipation requirements in a smaller volume. The resulting elevated temperature, if not held within predetermined limits, will impair the operation of the equipment. Some means must, of course, be devised for lowering or maintaining operating temperatures within satisfactory limits. It is not sufficient to force cooling air around the components because space is limited, and the amount of cooling air that can be introduced is insufficient. A further requirement of airborne equipment which is increasingly evident is that the equipment be composed as far as possible of modular units, that is, units that can be easily plugged in or out for replacement or servicing as the case may be. These modular units must be small and compact, and this means a further reduction in the amount of space available for cooling air flow about the components mounted therein.

There has been devised heretofore a means of cooling the components by providing a rather thick chassis, about ¼ inch thick, on which the components are mounted with holes through the length of the chassis and then forcing air through these holes. This has advantages, but it is costly and time consuming to drill such long holes accurately which may be 4 inches or longer in length and ⅛ inch in diameter in a quarter inch plate. Additional disadvantages are that after components or components holders, such as heat dissipating tube shields, are soldered to one side of the chassis, it is difficult and almost impossible to solder similar components on the opposite side because of the chassis mass which requires large amounts of heat to melt the solder.

It is therefore an object of this invention to provide a fluid cooled chassis for electronic components which can be fabricated in a simple and inexpensive manner and which will permit easy assembly of components thereon.

A feature of this invention is a fluid cooled chassis for supporting electronic components which is composed of two separate plates at least one plate having on one side ribs running lengthwise thereof. The components are mounted on the individual plates by soldering or other conventional methods prior to assembling the two plates back to back so that the ribs form fluid passages therebetween.

It is a further feature to provide an electronic modular unit containing a fluid cooled chassis for supporting electronic components, the chassis of which is composed of two separate plates and which has fluid passageways therebetween formed by ribs on one or both of said plates.

The above-mentioned and other features and objects of this invention will become more apparent by reference to the following description taken in conjunction with the accompanying drawings, in which.

Figure 1:
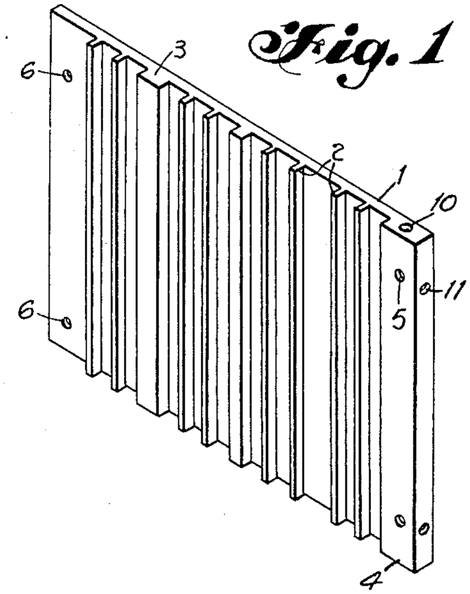
Fig. 1 is an isometric view of one plate having ribs on one side thereof.
Figure 2:
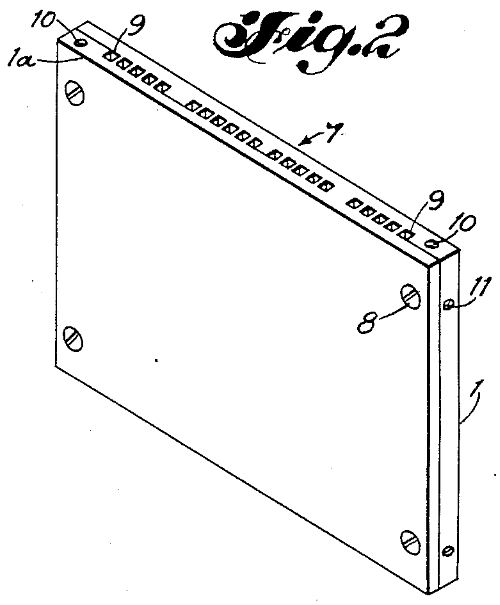
Fig. 2 is a view of two of the plates of Fig. 1 assembled back to back form a chassis.

Referring now to Figs. 1 and 2, there is shown a metal plate 1 with ribs 2 running lengthwise thereof. Ribs 3 and 4 are parallel to and are made wider than rib 2 to provide additional material where mounting holes are to be drilled or tapped for assembly of the plate or for mounting of components. Tapped holes 5 and clearance holes 6 are provided at the opposite ends of plate 1 so that when two plates 1 and 1*a* are assembled back to back, as shown in Fig. 2 to form chassis 7, they can be secured together with screws 8. Plates 1 and 1*a* are identical and the ribs 2, 3 and 4 form partitions for fluid passages 9 between plates 1 and 1*a*. Holes 10 are provided in the end surfaces of rib 4 and holes 11 in the sides thereof so that the chassis can be assembled to supporting plates as will be described later.

Figure 3:
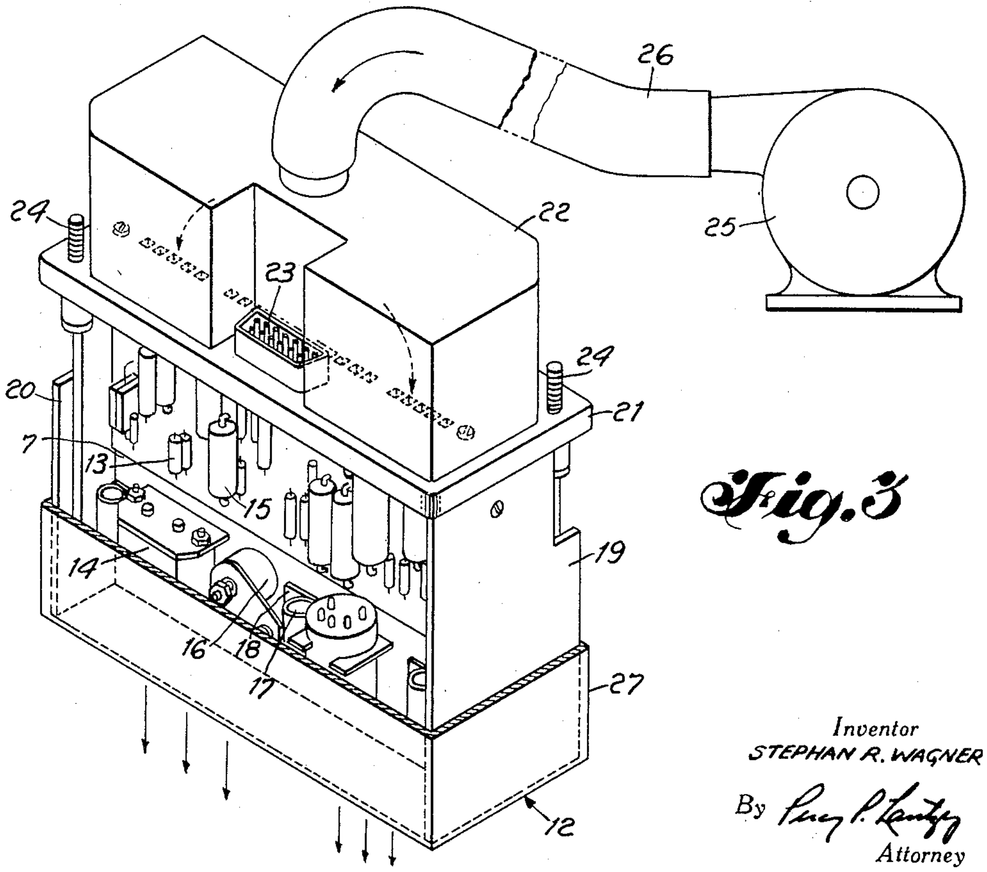
Fig. 3 is an assembly of an electronic modular unit containing the chassis of Fig. 2.

The complete modular unit 12 is shown in Fig. 3. On the chassis 7 there have been assembled components required for the circuitry of this unit such as resistor 13, transformer 14, capacitor 15, potentiometer 16 and subminiature tube 17. Subminiature tube 17 is secured in a heat dissipating tube shield bracket 18 which is soldered to the chassis 7 to provide greater heat transmission from the tube 17 to the chassis 7. The chassis 7 is supported by the side plates 19 and 20 and the base plate 21. A plenum chamber 22 is secured over the base plate 21 leaving exposed a multi-pin connector 23 and mounting screws 24. An air pump 25 is coupled to the plenum chamber by a connecting tube 26. Cooling air is forced by the pump 25 through the tube 26 into the plenum chamber 22. The air then flows through the passages 9 formed by the ribs 2, 3 and 4 absorbing heat from the chassis 7. The heated air is then exhausted through holes (not shown) in a cover 27.

Figures 4, 5, 6:
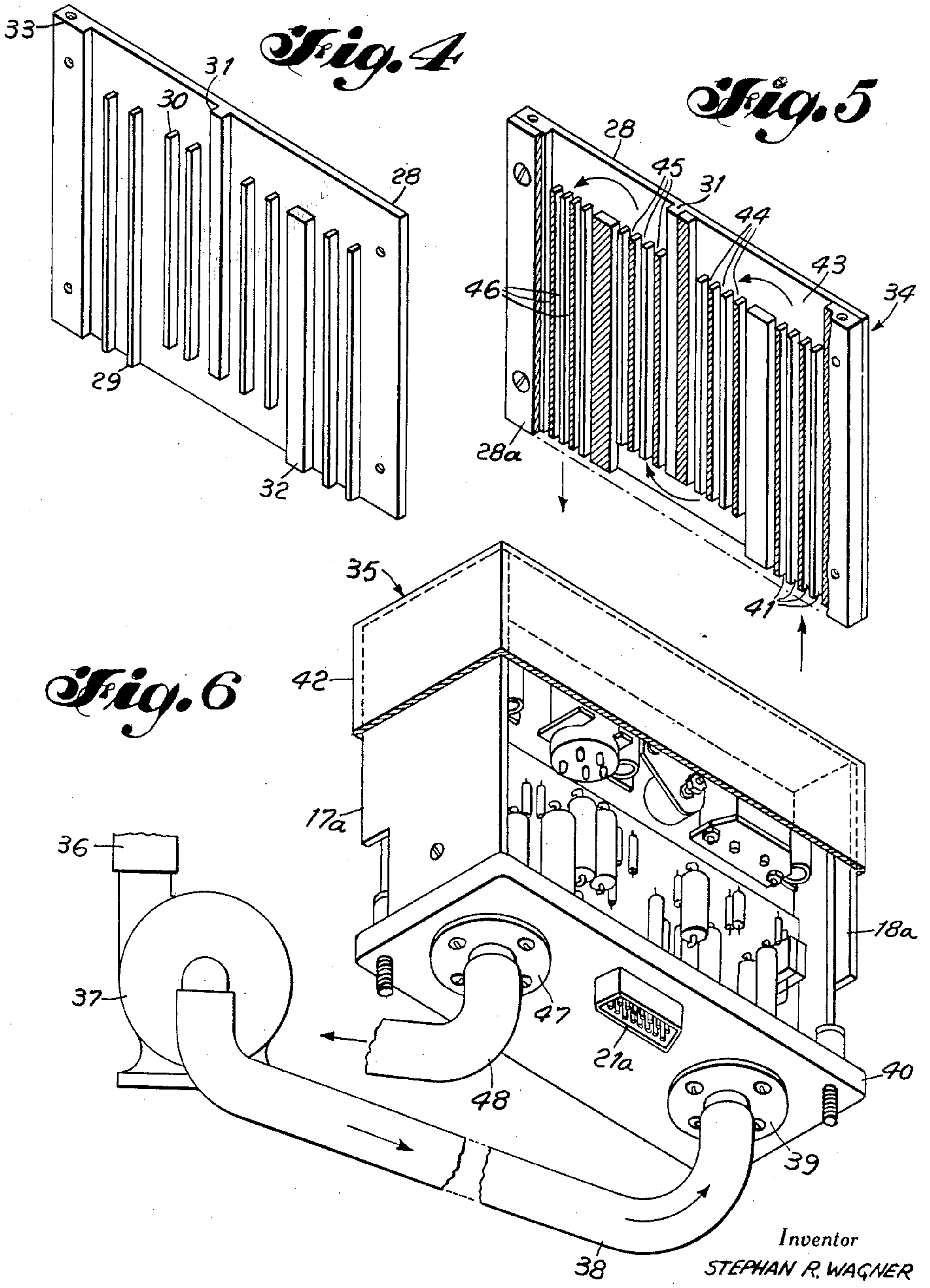
Fig. 4 is another embodiment of the ribbed plate of this invention.
Fig. 5 is the assembly view of two of the plates of Fig. 4 assembled back to back to form a chassis.
Fig. 6 is an assembly view of an electronic modular unit with the chassis of Fig. 5.

The embodiment shown in Figs. 4, 5 and 6 is adapted for the use of water or other liquid coolant. The design of the chassis plate 28 is similar to that of chassis plate 1 except that the ribs 29, 30, 31 and 32 do not extend the entire length of the plate 28. Rib 33 extends the whole length. When the two plates 28 and 28*a* are fastened together the chassis 34 of Fig. 5 is the result. The modular unit 35 is similar to the modular unit 12 of Fig. 3 except for the rib structure of the chassis plates and the cooling system. The path of flow of the liquid coolant is shown by the arrows. Starting with an intake 36 to a pump 37, the coolant flows through a tube 38 into a coupling 39 which is tightly secured to the base plate 40. The coolant then flows through the passageways 41, Fig. 5, where the plate 28*a* has been cut away to show the fluid passages more clearly. At the end of the passage 41 the coolant is forced by the cover 42 which fits tightly against the upper end of the chassis 34 to flow across the space 43 and through the passages 44, since any flow normal to the passages 43 is blocked by the partitions 31. At the termination of the passages 44, the coolant flows crosswise and back through passages 45, then again crosswise and through passages 46 through coupling 47 and is exhausted through tube 48 to the coolant reservoir. In this embodiment a metal-to-metal adhesive was used to cement the contacting surfaces of the two plates and seal any leaks that tend to allow the coolant to flow under the ribs from one passage to another.

The plates 1 or 28 which comprise the chassis can be made in a variety of ways and used with either gas or liquid as the coolant. One plate can be fabricated to contain all the ribs, and the second plate can be simply a flat plate covering the ribbed portion of the first plate. The most inexpensive method is the one that was used in the reduction to practice of this invention. Two identical plates were cut from an extruded aluminum strip containing ribs on one surface thereof. The components were assembled separately on each plate, then the two plates were mounted back to back with the ribs interleaved with channel spaces between adjacent ribs, and the circuit wiring applied as required. It was then an easy matter to assemble the remaining parts to form the complete modular unit.

While I have described above the principles of my invention in connection with specific apparatus, it is to be clearly understood that this description is made only by way of example and not as a limitation to the scope of my invention as set forth in the objects thereof and in the accompanying claims.

I claim:

1. A fluid cooled electronic unit comprising a relatively thick chassis for supporting electronic components, said chassis consisting of first and second plates, one of said plates being thicker than the other and containing a plurality of ribs disposed on the back side of said plate so that when the two plates are assembled back to back fluid passageways are provided therebetween, some of said ribs being wider than the other, said wider ribs containing mounting holes for said electronic components, means associated with said mounting holes for mounting said components on said plates on the front side of said plates before said plates are assembled together, means to secure said plates back to back in abutting relation, and means for forcing cooling fluid through said fluid passages to produce transfer of heat from said electronic components to said fluid.

2. A fluid cooled electronic unit comprising a relatively thick chassis for supporting electronic components, said chassis consisting of first and second identical plates, each of said plates containing a plurality of ribs disposed on the back side of each said plates so that when the two plates are assembled back to back the ribs thereof are interleaved and fluid passageways are provided therebetween, some of said ribs being wider than the others, said wider ribs containing mounting holes for said electronic components, means associated with said mounting holes for mounting said components on the front side of said plates before said plates are assembled together, means to secure said plates back to back in abutting relation and means for forcing cooling fluid through said fluid passages to provide transfer of heat from said electronic components to said fluid.

3. A fluid cooled chassis according to claim 2, wherein said ribs extend completely across said plate.

4. A fluid cooled chassis according to claim 2, wherein said ribs extend partially across said plate in an alternate relation to provide cooling passages extending back and fourth across the area of said chassis.

5. A fluid cooled electronic unit according to claim 2, wherein said cooling fluid is air and said means for forcing said air through said passages include a plenum chamber, means for coupling said plenum chamber to said passages, an air pump, and means coupling the output of said air pump to said plenum chamber.

6. A fluid cooled electronic unit according to claim 2, wherein the cooling fluid is liquid and said means for forcing said liquid through said passages include a pump, a source of cooling liquid, means coupling said pump to said source, and means coupling the output of said pump to the input of said passages.

References Cited in the file of this patent

UNITED STATES PATENTS

| | | |
|---|---|---|
| 2,414,471 | Kotterman | Jan. 21, 1947 |
| 2,692,961 | Fondiller | Oct. 26, 1954 |
| 2,831,662 | Hirsch | Apr. 22, 1958 |